United States Patent
Sakata et al.

(10) Patent No.: US 6,419,482 B1
(45) Date of Patent: *Jul. 16, 2002

(54) OPENING AND CLOSING APPARATUS OF AN OPENING AND CLOSING LID OF A BOX ACCOMMODATING AN OBJECT TO BE PROCESSED AND A PROCESSING SYSTEM OF AN OBJECT TO BE PROCESSED

(76) Inventors: Kazunari Sakata; Tamotsu Tanifuji; Masahiro Ogawa, all of c/o Tokyo Electron Tohoku Limited, 2-41, Machiya 1-Chome, Shiroyama-Machi, Tsukui-Gun, Kanagawa 200-0101 (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/640,908

(22) Filed: Aug. 18, 2000

Related U.S. Application Data

(63) Continuation of application No. PCT/JP00/04701, filed on Jul. 13, 2000.

(30) Foreign Application Priority Data

Jul. 14, 1999 (JP) ............................................. 11-201000

(51) Int. Cl.[7] ................................................. F27D 1/18
(52) U.S. Cl. ......................... 432/250; 432/253; 49/373; 49/464
(58) Field of Search ................................ 432/250, 251, 432/253, 254.1, 237; 110/181, 173 R; 49/128, 129, 303, 373, 463, 464; 266/262

(56) References Cited

U.S. PATENT DOCUMENTS

| 4,335,081 A | * | 6/1982 | Sachs et al. ................. 432/250 |
| 4,796,543 A | * | 1/1989 | Barkley ....................... 432/250 |
| 5,054,418 A | * | 10/1991 | Thompson et al. ......... 432/253 |
| 5,217,369 A | * | 6/1993 | Brown et al. ................ 432/250 |
| 5,730,573 A | | 3/1998 | Masujima et al. |
| 5,752,796 A | | 5/1998 | Muka |
| 6,113,734 A | * | 9/2000 | Woo et al. ................... 432/250 |

FOREIGN PATENT DOCUMENTS

| EP | 0 827 185 A2 | 3/1998 |
| JP | 6-302679 | 10/1994 |
| JP | 7-161797 | 6/1995 |
| JP | 7-235580 | 9/1995 |
| JP | 8-279546 | 10/1996 |
| JP | 10-125763 | 5/1998 |
| JP | 11354622 A | 12/1999 |

* cited by examiner

Primary Examiner—Gregory Wilson
(74) Attorney, Agent, or Firm—Pillsbury Winthrop LLP

(57) ABSTRACT

An opening and closing apparatus (52, 54) opens and closes an opening and closing lid (10) which closes an opening part (4) of an accommodating box (2) for accommodating an object (W) to be processed and is locked by a locking mechanism (12). A key member (26) is mounted to a base table (90) via a bearing mechanism (92) in a state in which the key member is rotatable with respect to the base table (90) and movable in a vertical direction with respect to a front surface of the base table (90). A part of the opening and closing lid (10) is held by being put between the key member (26) and an elastic member (98) provided on a front surface of the base table. Thereby, the opening and closing lid (10) is prevented from being displaced with respect to the base table (90) when the opening and closing lid (10) is removed from the accommodation box (2).

9 Claims, 15 Drawing Sheets

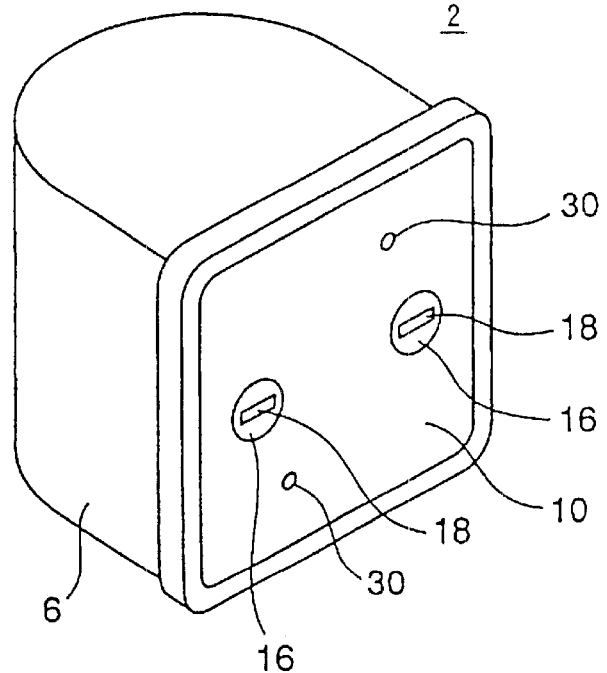
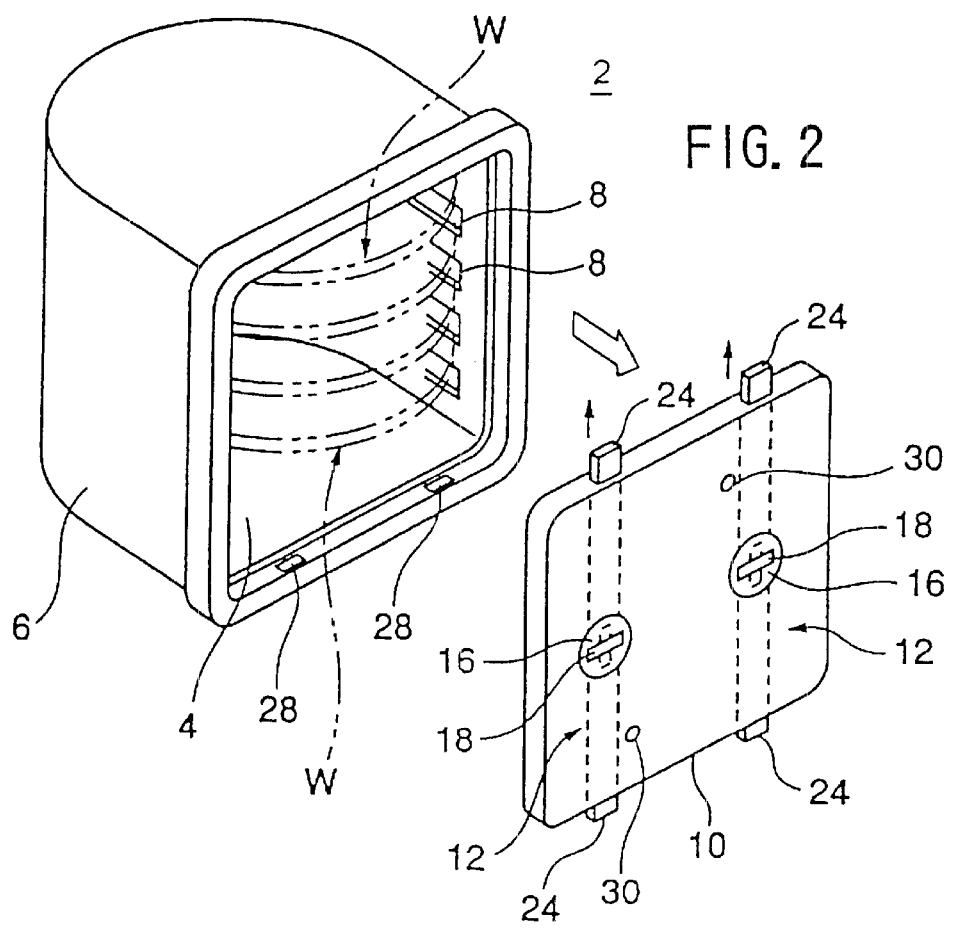

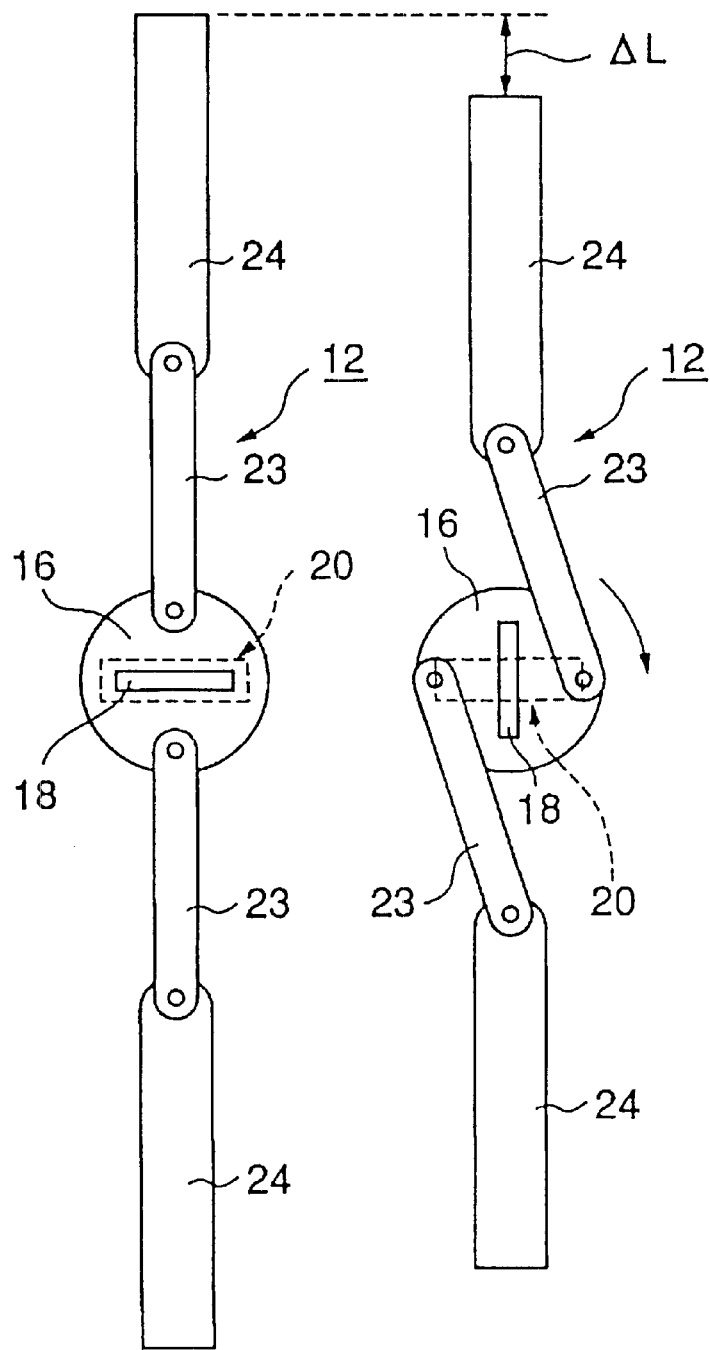

OPENING AND CLOSING APPARATUS OF AN OPENING AND CLOSING LID OF A BOX ACCOMMODATING AN OBJECT TO BE PROCESSED AND A PROCESSING SYSTEM OF AN OBJECT TO BE PROCESSED

This application is a continuation of PCT/JP00/04701 filed Jul. 13, 2000.

TECHNICAL FIELD

The present invention relates to an opening and closing apparatus of an opening and closing lid of an accommodation box for an object to be processed and a processing system using such an opening and closing apparatus and, more particularly, to an opening and closing apparatus of an opening and closing lid of an accommodation box for accommodating an object to be processed such as a semiconductor wafer in a sealed state and a processing system using such an opening and closing apparatus.

BACKGROUND ART

Generally, in order to fabricate a semiconductor integrated circuit such as an IC or an LSI, a film deposition process, an oxidation and diffusion process, an etching process, etc., are repeatedly performed with respect to a semiconductor wafer. Since these processes are preformed by separate processing apparatuses, the semiconductor wafer must be transported between the processing apparatuses. When transporting a semiconductor wafer, adhesion of foreign materials onto the surface of the semiconductor wafer and formation of a natural oxidation film must be prevented so to maintain the yield. Accordingly, the semiconductor wafer is transported while being accommodated in an accommodation box of an object to be processed.

As shown in FIG. 1 and FIG. 2, the accommodation box 2 of an object to be processed has a box container 6, which has an opening part 4 formed on one side thereof and has a semicircular shape on the other side. A plurality of support protrusions 8 are provided on an inner wall surface of the box container 6 so as to support the fringe of semiconductor wafers W. The semiconductor wafers W are accommodated in a multistep state at equal intervals in the vertical direction in a state in which the semiconductor wafers W are supported by the support protrusions 8.

Normally, twenty-five or thirteen wafers W can be accommodated in a single box 2. An opening and closing lid 10 formed of a hollow square plate is attached to the opening part 4 of the box container 6. The opening and closing lid 10 can maintain the box container 6 in a sealed state in a state in which the opening and closing lid 10 is attached to the opening part 4 of the box container, thereby preventing the accommodated wafers W from contacting an atmosphere.

The opening and closing lid 10 is provided with two locking mechanism 12 so that the opening and closing lid 10 can be fixed to the box container 6. Additionally, by releasing the locking mechanism 12, the opening and closing lid 10 can be removed from the opening part 4. Specifically, the locking mechanism 12 has a lock plate 16 rotatably mounted to the opening and closing lid 10 at a substantially middle position in the direction of height via a bearing 14, as also shown in FIG. 3A to FIG. 5. A key groove 18 having an elongated concave shape, which fits to a key member described later, is formed on the lock plate 16. The front of lock plate 16 is covered by a lock plate covering member 22 that has a key insertion hole 20 at a position corresponding to a position of the key groove 18 when it is locked.

The lock plate 16 is engaged with an arm 23, as also shown in FIGS. 3A and 3B and FIG. 4, so as to form a crank mechanism, which converts a circular arc motion into a liner motion. The arm 23 extends in a vertical direction, and a pin 24 is connected to each end of the arm 23. That is, each pin 24 is moved in the vertical direction by rotating the lock plate 16 by 90 degrees in the normal or reverse direction.

An end of each pin 24 is inserted into a pin hole 28 of the upper edge and the lower edge defining the opening part 4 as shown in FIG. 2 (only the upper edge is shown in FIG. 2) so that the opening and closing lid 10 does not separate from the opening part 4 when it is locked. It should be noted that each pin 24 is provided so as to extend vertically through the interior of the hollow opening and closing lid 10. Accordingly, as shown in FIG. 4 or FIG. 5, an unlocked state can be achieved by fitting the key member 26 in the key groove 18 and turning the key member 26 by 90 degrees from the locked state as shown in FIG. 3A so as to move the pin 24 backward to remove the pin 24 from the pin hole 28 (refer to FIG. 2).

Generally, the accommodation box 2 is automatically transported in a processing system provided with an automatic transporting mechanism of the accommodation box and a stock area temporarily storing the accommodation box. Additionally, the key member 26 is operated by an automatic device having the key member 26 so that the opening and closing lid 10 is automatically detached from and attached to the accommodation box 2 according the above-mentioned procedures. However, since the key member 26 is loosely fit in the key groove 18, there is a play between the key member 28 and the key groove 18. Accordingly, when the opening and closing lid 10 is unlocked so as to remove the opening and closing lid 10 from the opening part 4 and support the opening and closing lid 10 by the key member 26, the opening and closing lid 10 may be displaced by being inclined with respect to the key member 26. Accordingly, there is a problem in that the opening and closing lid 10 cannot be completely attached to the opening part 4 due to its disposition when closing the accommodation box 2 by attaching the opening and closing lid 10 to the opening part 4 after the process of the wafer is completed.

In order to solve such a problem, positioning holes 30 are provided to the opening and closing lid 10 so that positioning pins (not shown in the figure), which moves forward and backward together with the key member 26, can be inserted into the positioning holes 30 so as to support the opening and closing lid 10 by sharing the load of the opening and closing lid 10 with the positioning pins. However, since the positioning pins are designed so as to be loosely fitted in the positioning holes 30, the displacement of the opening and closing lid 10 cannot be completely eliminated. Thus, in order to prevent the opening and closing lid 10 from being displaced when the opening and closing lid 10 is removed, a vacuum pad that moves forward and backward together with the key member 26 is provided so as to hold the opening and closing lid 10 in a state in which the front surface of the opening and closing lid 10 is attracted by vacuum. However, in this case, there is a problem in that the opening and closing mechanism of the opening and closing lid 10 becomes complex due to the addition of the vacuum pad mechanism.

DISCLOSURE OF THE INVENTION

It is an object of the present invention to provide an improved and useful opening and closing apparatus of an opening and closing lid of an accommodation box of an object to be processed and a processing system in which the above-mentioned problems are eliminated.

More specific object of the present invention is to provide an opening and closing apparatus of an opening and closing lid of an accommodation box of an object to be processed and a processing system, which can prevent a displacement of the opening and closing lid when the opening and closing lid is removed.

In order to achieve the above-mentioned objects, there is provided according to one aspect of the present invention an opening and closing apparatus for opening and closing an opening and closing lid which closes an opening part of an accommodating box for accommodating an object to be processed and is locked by a locking mechanism, characterized in that the opening and closing apparatus comprises:

a base table;

a key member mounted to the base table via a bearing mechanism in a state in which the key member is rotatable with respect to the base table and movable in a vertical direction with respect to a front surface of the base table;

a key member turning mechanism which turns the key member in either a normal or reverse directions;

key member turning mechanism moving means for moving the key member turning mechanism in the vertical direction with respect to the base table;

horizontal moving means for moving the base table in a horizontal direction with respect to the accommodation box; and vertical moving means for moving the base table in a vertical direction with respect to the accommodation box.

According to the above-mentioned invention, the locking mechanism is unlocked by driving the vertical moving means and the horizontal moving means so as to insert the locking member into the key groove of the locking member of the opening and closing lid and turning the key member by the key member turning mechanism. Thereafter, a part of the opening and closing lid is sandwiched and held between the front surface of the base table and the key member by moving the key member turning mechanism moving means. Then, in this state, the opening and closing lid is removed by moving the base table backward by driving the horizontal driving means. Since the opening and closing lid is sandwiched and held by the key member and the base table, the opening and closing lid is prevented from being displaced with respect to the based table.

In the above-mentioned opening and closing apparatus, a part of the opening and closing lid may be held by being put between the key member and the elastic member by providing an elastic member on the front surface of the base table.

Additionally, there is provided according to another aspect of the present invention an opening and closing apparatus for opening and closing an opening and closing lid which closes an opening part of an accommodating box for accommodating an object to be processed and is locked by a locking mechanism, characterized in that the opening and closing apparatus comprises:

a base table;

a key member mounted on the base table via a bearing mechanism in a state in which the key member is rotatable with respect to the base table;

a key member turning mechanism which turns the key member in either a normal or reverse direction;

an assist table positioned in front of the base table and urged by a spring member in a direction apart away from the base table;

horizontal moving means for moving the base table in a horizontal direction with respect to the accommodation box; and vertical moving means for moving the base table in a vertical direction with respect to the accommodation box.

According to the above-mentioned invention, the locking mechanism can be unlocked by driving the vertical moving means and the horizontal moving means so as to insert the locking member into the key groove of the locking member of the opening and closing lid and turning the key member by the key member turning mechanism. When the key member is moved toward the opening and closing lid, the assist table provided on the front surface of the base table contacts the front surface of the opening and closing lid. At this time, the assist table presses the opening and closing lid by a spring force of the spring member. Accordingly, a part of the opening and closing lid is held by the spring force of the spring member by being put between the assist table and the key member. Then, in this state, the opening and closing lid is removed by moving the base table backward by driving the horizontal driving means. Since the opening and closing lid is sandwiched and held by the key member and the assist table, the opening and closing lid is prevented from being displaced with respect to the assist table, that is, the based table. Additionally, a part of the opening and closing lid may be held by being put between the key member and the elastic member by providing an elastic member on the front surface of the assist table. Further, it is preferable that the spring member be a coil spring provided between the base table and the assist table.

In the above-mentioned invention, it is preferable that at least two locking mechanisms be provided to the opening and closing lid, and a number of key members be equal to a number of the locking mechanisms.

Additionally, the key member turning mechanism may comprise an air cylinder generating a linear motion and a crank mechanism converting the linear motion into a rotating motion.

Alternatively, the key member turning mechanism may comprise: an air cylinder generating a linear motion; a belt driven by the air cylinder; and a pulley to which the key member is mounted, the pulley being rotationally driven by being engaged with the belt. According to this, the key member can be turned with a uniform torque, which prevents the key member from stopping in the middle of a turning operation.

Additionally, there is provided according another aspect of the present invention a processing system of an object to be processed which system has the opening and closing apparatus according to the above-mentioned present invention.

Other objects, features and advantages of the present invention will become more apparent from the following detailed description when read in conjunction with the accompanying drawings

BRIEF DESCRIPTION OF THE DRAWINGS

FIG. 1 is a perspective view of an accommodation box of an object to be processed.

FIG. 2 is a perspective view of the accommodation box of an object to be processed in a state in which an opening and closing lid is open.

FIGS. 3A and 3B are vies showing a locking mechanism of the opening and closing lid.

BEST MODE FOR CARRYING OUT THE INVENTION

Figure 7:
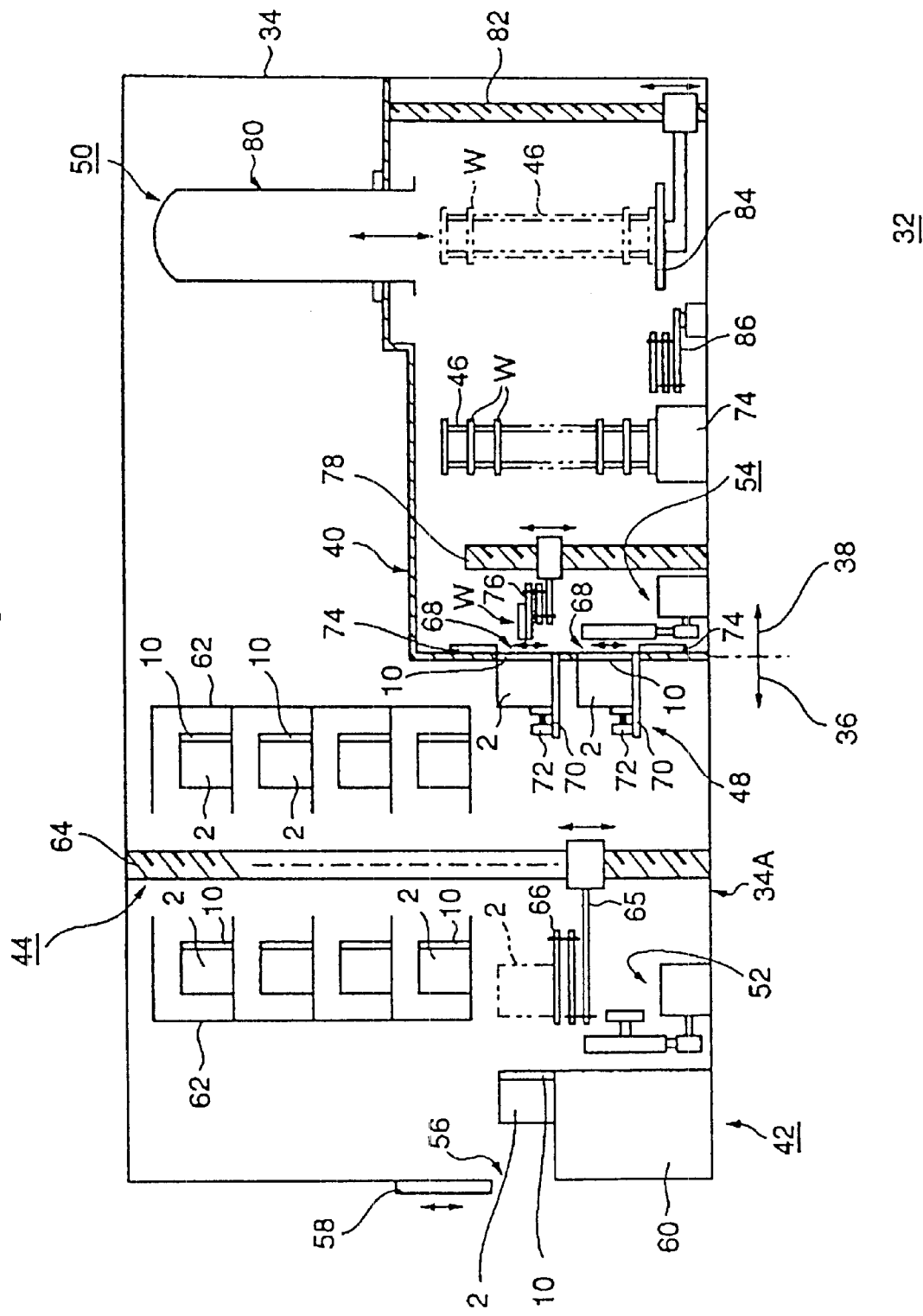
FIG. 7 is an illustrative structural view of a processing system according to a first embodiment of the present invention.
Figure 8:
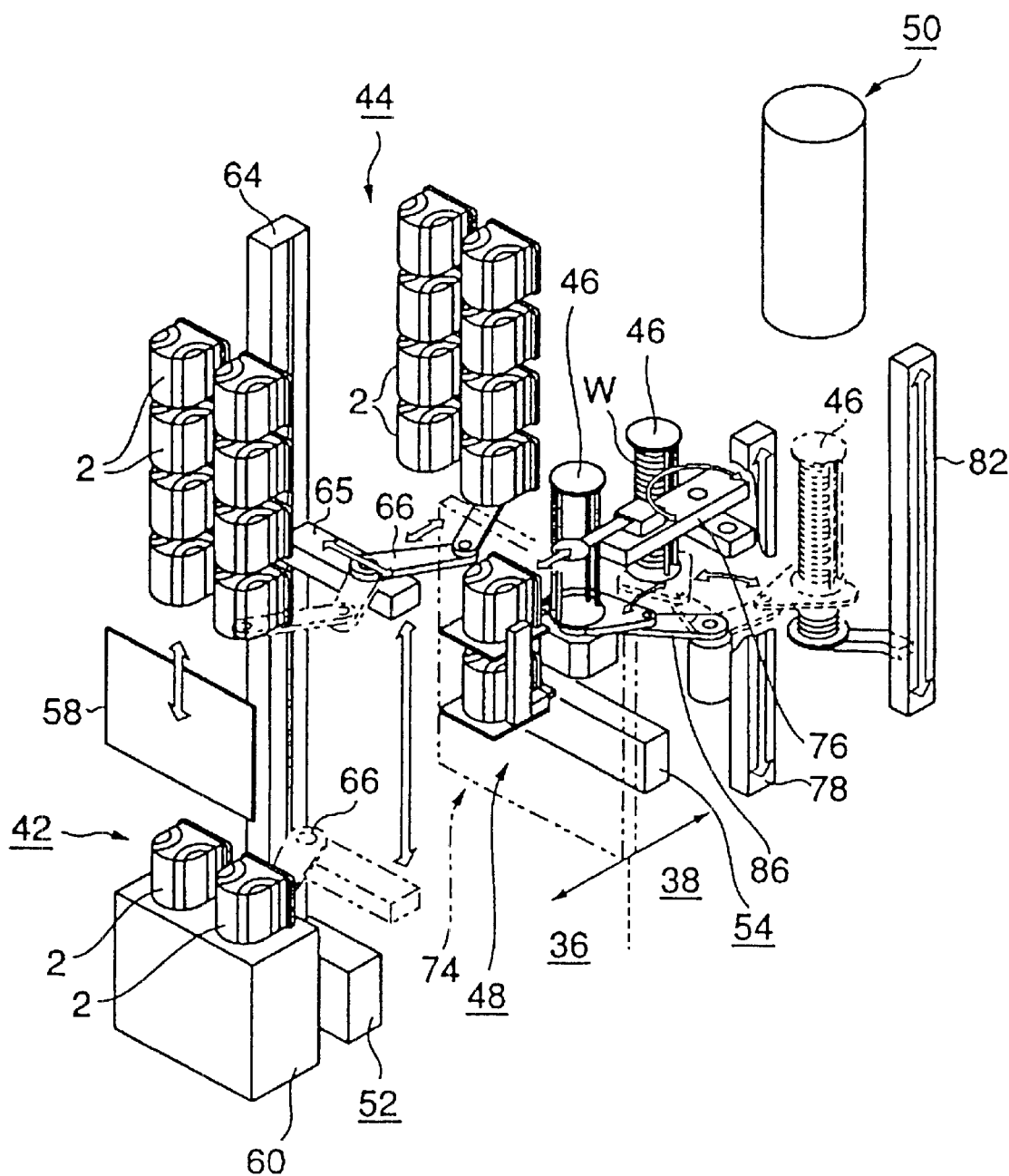
FIG. 8 is a perspective view of the system shown in FIG. 7.
Figure 9:
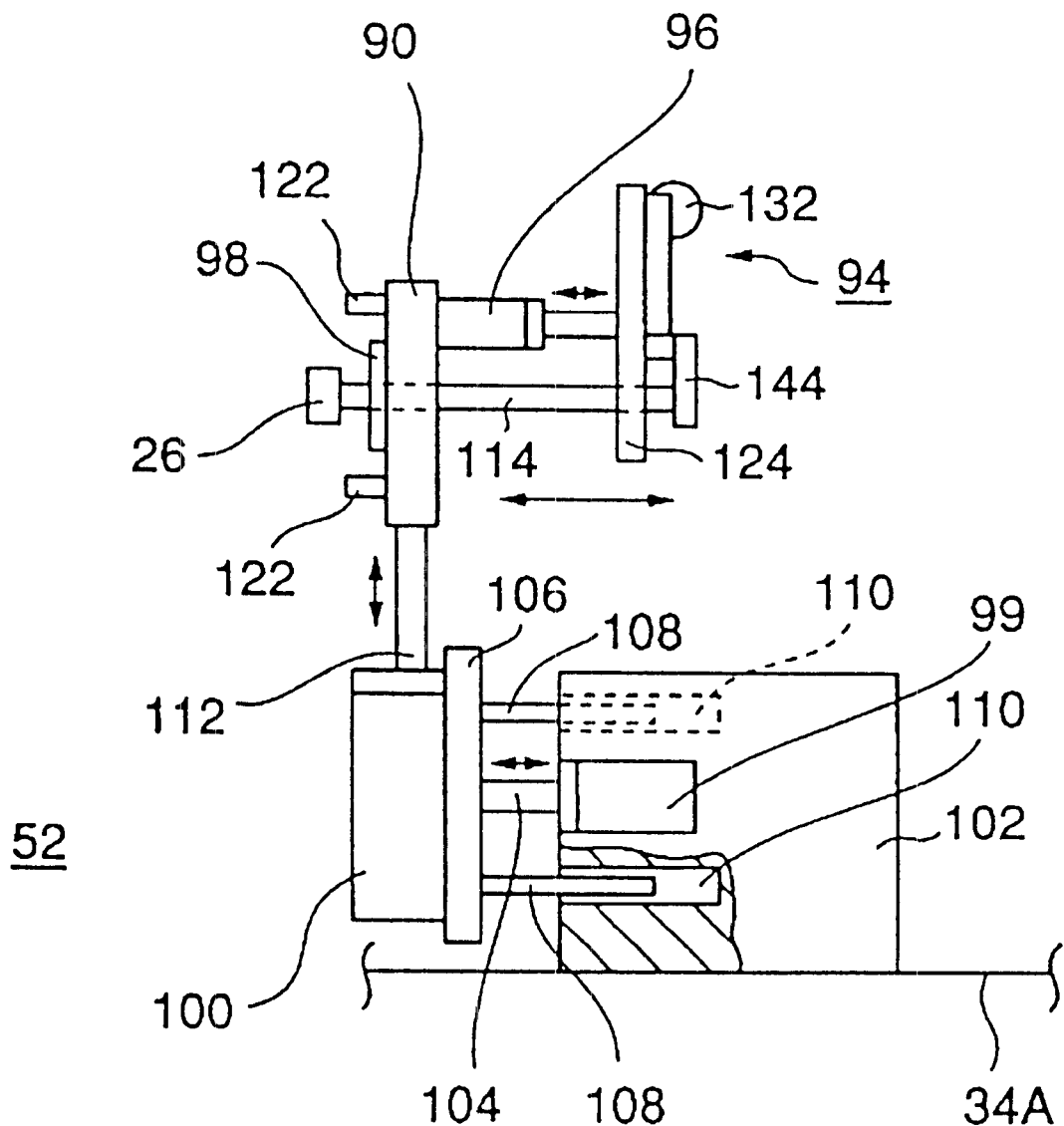
FIG. 9 is a side view showing an opening and closing apparatus according to the first embodiment of the present invention.

A description will now be given, with reference to FIG. 7 to FIG. 12, of an opening and closing apparatus of an opening and closing lid of an accommodation box off an object to be processed and a processing system of an object to be processed according to a first embodiment of the present invention. FIG. 7 is a schematic structural view of the processing system of an object to be processed according to the first embodiment of the present invention. FIG. 8 is a schematic perspective view of the processing system according to the present invention. FIG. 9 is a side view showing an opening and closing apparatus of an opening and closing lid of an accommodation box of an object to be processed.

Figure 10:
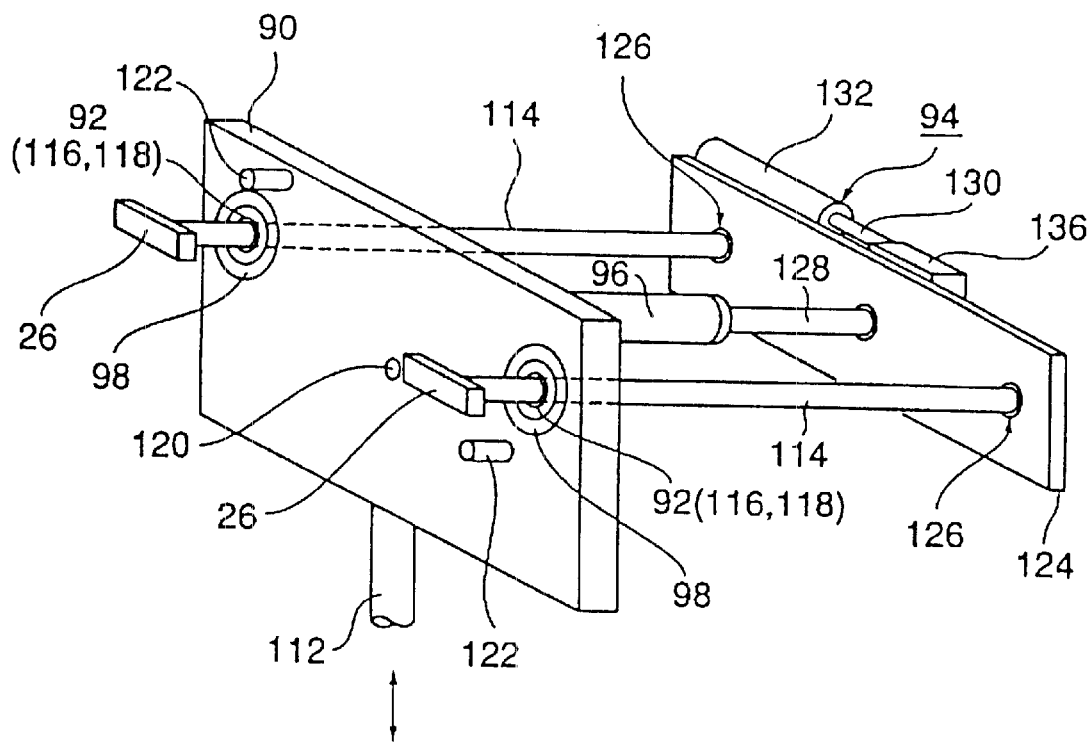
FIG. 10 is a perspective view showing the opening and closing apparatus according to the first embodiment of the present invention.
Figure 11:
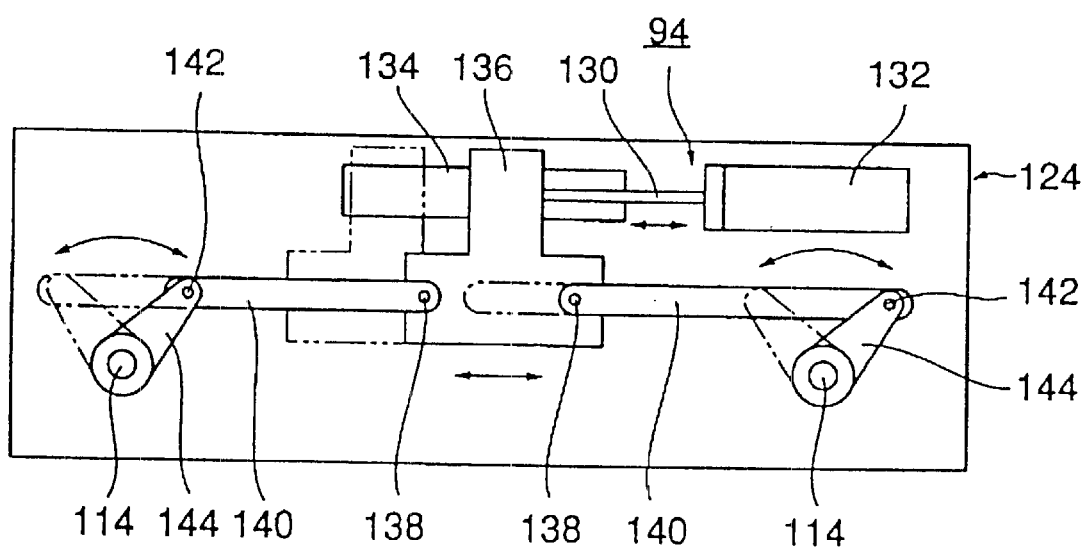
FIG. 11 is a rear view of the opening and closing apparatus according to the first embodiment of the present invention.
Figure 12:
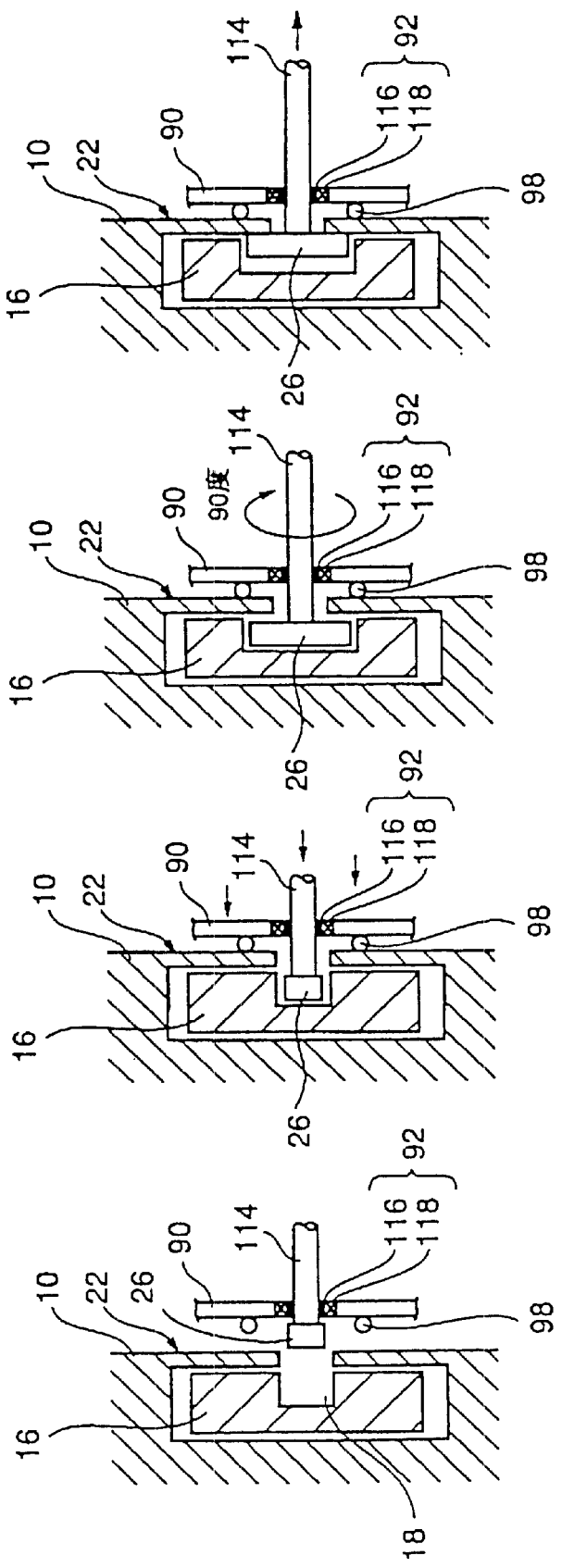
FIGS. 12A, 12B, 12C and 12D are views for explaining an opening and closing operation of the opening and closing apparatus according to the first embodiment of the present invention.

FIG. 10 is a perspective view showing a part of the opening and closing apparatus shown in FIG. 9. FIG. 11 is a rear view of the part of the opening and closing apparatus shown in FIG. 10. FIG. 12 is an illustration for explaining an opening and closing operation of the opening and closing apparatus shown in FIG. 9.

First, a description will be given, with reference to FIG. 7 and FIG. 8, of the processing system of an object to be processed. As shown in the figures, the processing system 32 of an object to be processed is surrounded by a housing 34 in its entirety, the housing being made of, for example, stainless steel and the like. An interior of the processing system 32 is divided by a separation wall 40 into an accommodation box transportation area 36 for transporting an accommodation box 2 and a wafer transportation area 38 for transporting a semiconductor wafer W that is an object to be processed. The processing system 32 comprises: a transportation port 42 for transporting the accommodation box 2 into or out of the system 32; a stocker unit 44 for temporarily storing the accommodation box 2; a transfer stage 48 for transferring the semiconductor wafer W between the accommodation box 2 and the boat 46 of the object to be processed; a processing unit 50 for applying a predetermined process to the object W to be processed which object is transferred to the boat 46 of the object to be processed and is held therein; and first an second opening and closing apparatuses 52, 54 provided in the vicinity of the transportation port 42 and the transfer stage 48.

In the transportation port 42, a box transportation opening 56 are formed in the housing 34, and an opening and closing door 58 is provided to the transportation opening 56. Additionally, a first placement table 60 is provided inside the box transportation opening 56 so as to place the accommodation box 2 thereon, which accommodation box is transported from outside. Additionally, a first opening and closing apparatus 52 according to the first embodiment of the present invention is provided directly under the box transportation opening 56 so as to temporarily open and close the opening and closing lid 10 of the accommodation box 2. The reason for temporarily removing the opening and closing lid 10 of the accommodation box 2 is to detect the number of wafers within the accommodation box 2 and the position of the wafer in the accommodation box 2 by a sensor (not shown in the figure). A structure of the first opening and closing apparatus 52 will be described later.

Additionally, the above-mentioned stocker unit 44 is positioned in an upper part of the accommodation box transportation area 36. In the stocker unit 44 of the present embodiment, two shelf stages 62 are provided so that the above-mentioned accommodation boxes 2 are temporarily placed in for steps of two rows. Accordingly, 16 (=8×2) accommodation boxes 2 in total can be temporarily stored in the stocker unit 44. An elevator 64 is provided between the two shelf stages 62. The elevator 64 is movably provided with an up-and-down rod 65 extending in the vertical direction so as to be movable in the vertical direction, and the up-and-down rod 65 is provided with a rotatable and bendable box transportation arm 66 so as to be movable in the horizontal direction. Accordingly, the accommodation box 2 can be held by the box transportation arm 66 by moving and bending the box transportation arm 66 so as to transport the accommodation box 2 between the transportation port 42 and the stocker unit 44.

Additionally, in the above-mentioned transfer stage 48, the separation wall 40 separating the areas 36 and 38 is provided with two openings 68 that have the same size as the opening part 4 of the accommodation box 2 (refer to FIG. 2).

On the side of the accommodation box transportation area 36 with respect to the openings 68, two second placement tables 70 are provided horizontally so that the accommodation box 2 can be placed thereon. Additionally, on one side of each of the second placement tables 70, a horizontal actuator 72 is provided so as to press und urge the accommodation box 2 placed on the second placement table 70 toward the separation wall 40. The horizontal actuator 72 presses the accommodation box 2 in a state in which the opening and closing lid 10 of the accommodation box 2 faces the opening 68 so that the opening edge of the opening part 4 of the box container 6 is sealingly contact with the opening edge of the opening 68 of the separation wall 40. Additionally, the opening 68 is provided with an opening and closing door 74, which opens and closes the opening 68.

A second opening and closing apparatus 54 according to the present embodiment is provided in the wafer transportation area 38 under the opening 68 so as to open and close the opening and closing lid 10 of the accommodation box 2. The structure of the opening and closing apparatus 54 will be described later. In the wafer transportation area 38, two boat placement tables 74 (only one shown in FIG. 7) are provided on which the boat 46 of an object to be processed such as a wafer boat is placed. A rotatable and bendable wafer transportation arm 76 is provided between eth boat placement table 74 and the stage 48, and the wafer transportation arm 76 is movable in the vertical direction by the elevator 78. Accordingly, the wafer W can be transferred between the accommodation box 2 on the second placement table 70 and the boat placement table 74 by bending, rotating and moving the wafer transfer arm 76.

The boat 46 of an object to be processed is, for example, made of quartz, and is configured to support, for example, 50 to 150 wafers in a multistep arrangement a predetermined pitch. Additionally, a processing unit 50 is provided in an upper part of one side of the wafer transportation area 38. The processing unit 50 is a vertical type heat treatment furnace, and has a quartz made process chamber 80 having a cylindrical shape. The process unit 50 can simultaneously apply a predetermined heat treatment such as a film deposition process or an oxidation and diffusion process to many wafers.

A cap 84 is positioned under the process chamber 80, the cap 84 being movable in the vertical direction by the elevator 82. The boat 46 can be loaded to inside the process chamber 80 through a lower end opening of the process chamber 80 by placing the boat 46 on the cap 84 and moving the cap 84 in the vertical direction. At this time, the lower end opening of the process chamber 80 can be closed by the above-mentioned cap 84 in an airtight manner. A bendable and rotatable transportation arm 86 is provided between the cap 84 at a low position and the above-mentioned boat placement table 74 so that boat 64 of an object to be processed can be transferred between the boat placement table 86 and the cap 84.

Next, a description will be given of an operation of the thus-structured processing system 32. First, the wafer transportation area 38 is filled by an inert gas such as N2 gas so as to prevent a natural oxidation film formed on a surface of a wafer, and the accommodation box transportation area 36 is maintained to be a clean air atmosphere. The accommodation box 2 transported from outside is placed on the first placement table 60 of the transportation port 42 in a state in which the opening and closing lid 10 faces the opening and closing door 58. Then, the box transportation opening 56 is opened by sliding the opening and closing door 58 upward.

Next, the opening and closing lid 10 of the above-mentioned accommodation box 2 is temporarily removed by driving the first opening and closing apparatus 52, and the number of wafers and the position of the wafers accommodated in the accommodation box 2 are detected by the sensor (not shown in the figure). After the completion of the detection, the first opening and closing apparatus 52 is driven again so as to attach the opening an closing lid 10 to the accommodation box 2 again. At this time, as described later, the opening and closing lid 10 can be accurately reattached to the accommodation box 2 without positional offset.

Next, the accommodation box 2 positioned at the transportation port 42 is held by the box transportation arm 66 by driving the box transportation arm 66. Further, the accommodation box 2 is transported to a predetermined position on the shelf stage 62 in the stocker unit 44 by driving the elevator 64. The accommodation box 2 is temporarily stored at this position. At the same time, the box transportation arm 66 moves to take the accommodation box 2, which has been temporarily stored in the shelf stage 62 and is rendered to be an object to be processed. Then the accommodation box 2 is transferred to the second placement table 70 of the transfer stage 48 by downwardly moving the box transportation arm 66 by driving the elevator 64 as mentioned above. At this time, the opening and closing lid 10 of the accommodation box 2 is positioned to face the opening and closing door 74 provided on the separation wall 40, and the accommodation box 2 is fixed onto the second placement table 70 by being pressed and urged by the horizontal actuator 72 provided on one side of the second placement table 70.

In this state, the opening 68 is opened by slidingly moving opening and closing door 74. Since the fringe of the opening part of the accommodation box 2 is pressed against the separation wall 40 so as to be in an airtight state, there is no gas flowing between the areas 36 and 38. Then, the opening and closing lid 10 provided to the accommodation box 2 is removed by driving the second opening and closing apparatus 54. Further, the wafers W accommodated in the accommodation box 2 is taken out on a one by one basis by driving the wafer transportation arm 76 and the elevator 78, and the wafers W are transferred to the boat 46 of an object to be processed.

After the transfer of the wafers W to the boat 46 of an object to be processed, the boat 46 on the boat placement table 74 is moved and placed on the cap 84 positioned at the lowest end by driving the boat transportation arm 86. Then, after the completion of the transfer of the boat 46 of an object to be processed, the cap on which the boat 46 of an object to be processed is placed is moved upward by driving the elevator 82 so as to introduce and load the boat 46 in to the process chamber 80 of the processing unit 50 through the lower end opening of the process chamber 80. Then, the lower end opening of the process chamber 80 is sealingly closed by the cap 84. In this state, a predetermined heat treatment such as a film deposition processor an oxidation and diffusion process is applied to the wafers W in the processing unit 50.

After the predetermined heat treatment is completed, the processed wafers W are taken out by performing the above-mentioned operation in the reverse manner. That is, the boat 46 of an object to be processed is unloaded from the process chamber 80, and is transferred onto the boat placement table 74. Thereafter, the processed wafers W are transferred from the boat 46 to the accommodation box 2 of the second placement table 70 by using the wafer transportation arm 76. The transfer of the processed wafers W in the accommodation box 2 is completed, the second opening and closing apparatus 54 is driven so as to reattach the opening and closing lid 10 to the accommodation box 2. At this time, as described later, the opening and closing lid 10 can be accurately reattached to the accommodation box 2 without positional offset.

Next, the opening and closing door 74 is closed so as to airtightly separate the areas 36 and 38, and, then, the accommodation box 2 is temporarily stored in the stocker unit 44 or transferred onto the first placement table 60 of the transportation port 42 through the box transportation opening 56 without storage, and the accommodation box 22 is transported to outside of the processing system 32. It should be noted that the above-mentioned flow of the accommodation box 2 is merely an example, and is not limited to such a flow.

A description will now be given, with reference to FIG. 9 through FIG. 12D, of the first opening and closing apparatus 52 provided in the vicinity of the transportation port 42. FIG. 9 is a side view of the first opening and closing apparatus 52. The opening and closing apparatus 52 comprises: a plate-like base table 90; a key member 26 provided to the base table 90 via a bearing mechanism 92 (refer to FIG. 10) which enables the key member 26 to turn and slide with respect to the base table 90; a key member turning mechanism 94 turning the key member 26 in a normal or reverse direction; a key member turning mechanism moving means 96 for moving the key member turning mechanism 94 with respect to the base table 90; an elastic member 98 provided on the front surface of the base table 90 so as to prevent the opening and closing lid 10 from slipping when the opening and closing lid 10 is put between the key member 26 and the base table 90; a horizontal moving means 99 for moving the base table 90 in the horizontal direction; and a vertical moving means 100 for moving the base table 90 in the vertical (up and down) direction.

The horizontal driving means 99 comprises a slide type actuator provided on the fixing table 102 that is fixed on a bottom 34A of the housing 34. The horizontal moving means 99 moves the horizontal moving rod 104 forward and backward in the horizontal direction in a position adjustable manner. A mounting table 106 on which the vertical moving means 100 is mounted is fixed to the end of the rod 104. Additionally, a guiding rod 108 is mounted to the mounting table 106 so that the guiding rod 108 is parallel to the horizontal moving rod 104. The end of the guiding rod 108 is inserted into a guiding groove 110 provided on the fixing table 102 so as to guide the mounting table 106 when the mounting table 106 is moved.

Additionally, the vertical moving means 100 also comprises a slide type actuator, and a vertical moving rod 112 is movable in an upward and downward direction. The base table 90 is mounted to an end of the vertical moving rod 112. The base table 90 is provided with a main operation rod 114 that constitutes a base of the elongated rectangular-parallelepiped key member 26, the rod 114 extends through the base table 90 via the bearing mechanism 92.

Two key members 26 are provided with a predetermined distance apart from each other in the horizontal direction as shown in FIG. 10. The bearing mechanism 92 is mounted to the rod 114 as shown in FIG. 12A through 12D. The bearing mechanism 92 comprises a slide bearing 116 which enable the bearing mechanism 92 to slide along the axial direction of the main operation rod 114 and a rotational bearing 118 mounted on an outer surface of the slide bearing 116. Thereby, the main operation rod 114 is slidable and rotatable with respect to the base table 90.

The ring-like elastic member 98 which is made of, for example, a silicon rubber is mounted on the front surface of the base table 90 so as to surround the piercing portion of the main operation rod 104. Additionally, a detection switch 120 and two positioning pins 122 are provided on the front side of the base table 90, the detection switch 120 outputting a detection signal when the base table approaches the opening and closing lid 10 of the accommodation box 2. Each of the positioning pins 122 has a conical end and protrudes forwardly. The positioning pins 122 are inserted into the respective positioning holes 30 of the opening and closing lid 10 shown in FIG. 1 so as to perform a positioning operation of the base table 90 and the opening and closing lid 10.

The base end of the main operation rod 114 is provided to the assist plate 124 via a rotational bearing 126 so that the rod 114 extends through the assist plate 124. Additionally, the key member turning mechanism moving means 96 comprises a slide type actuator which drives the assist plate 124 in the vertical direction. The assist plate 124 is mounted to an end of the rod 128 of the slide type actuator.

The above-mentioned key member turning mechanism 94 is mounted on a side opposite to the base table 90 with respect to the assist plate 124. The key member turning mechanism 94 has an air cylinder 132 provided with a horizontally movable rod 130. A moving member 36, which is movable along a guide rail 134, is mounted on an end of the rod 130. Two horizontal rods 140 extend in opposite directions from opposite ends of a lower portion of the moving member 136, the horizontal rods 140 being swingably mounted via rotational pins 142. Two operation rods 144 are mounted on opposite ends of each of the horizontal rods 144 via rotational pins 142. An end of each of the two operation rods 144 is fixed to a base end of the respective one of the main operation rods 114 that are provided in a state in which the main operation rods 114 extend through the assist plate 124 in a rotatable manner. Accordingly, as indicated by solid lines and virtual lines in FIG. 11, the main operational rods 114 can be turned in the same direction by about 90 degrees in a normal or reverse direction by moving the rod 130 forward or backward by driving an air cylinder 132.

A description will now be given, with reference to FIGS. 12A through 12D, of an operation of the thus-structured first opening and closing apparatus 52. It should be noted that only a main part is shown in FIGS. 12A through 12D, and the arm 23 connected to the lock plate 16 (refer to FIG. 15) is omitted.

Figure 4:
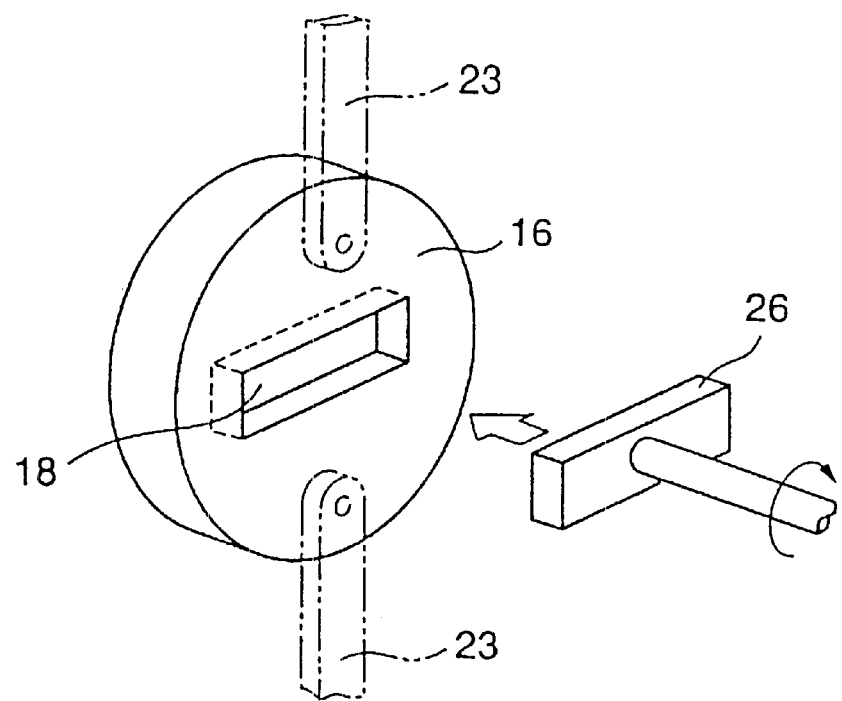
FIG. 4 is a perspective view for explaining an operation of the locking mechanism by a key member.
Figure 5:
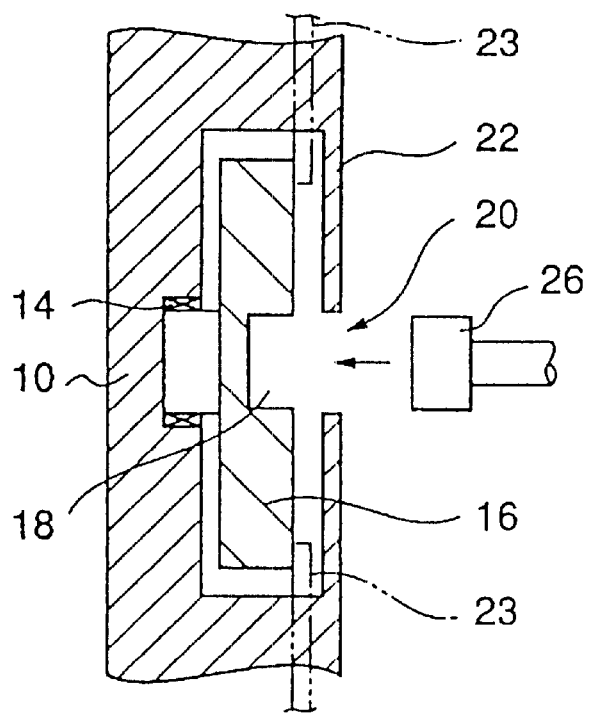
FIG. 5 is a cross-sectional view of a main part of a locking mechanism.
Figure 6:
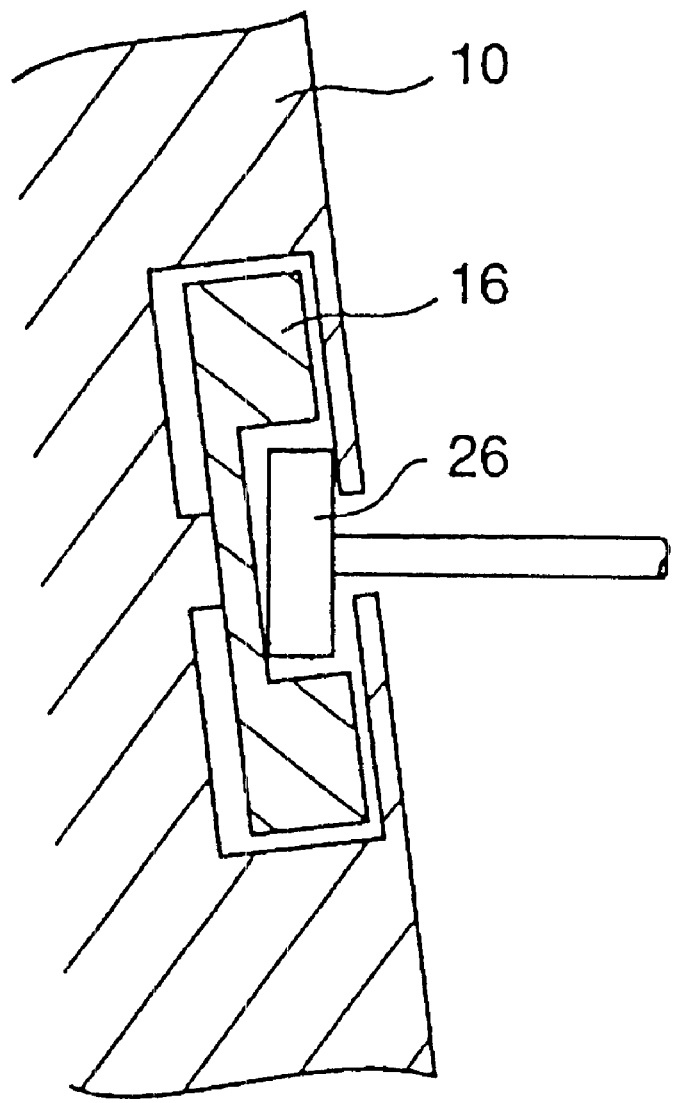
FIG. 6 is a cross-sectional view of a state in which the opening and closing lid is inclined and displaced when the opening and closing lid is removed.

As mentioned above, the first opening and closing apparatus 52 is for opening and closing the opening and closing lid 10 of the accommodation box 2 placed on the transportation port 42. First, the base table 90 is moved close to the opening and closing lid 10 by driving the horizontal moving means 99 provided to the fixing table 102 and the vertical moving means 100 provided to the mounting table 106. Then, positioning of the base table 90 is performed by inserting the two positioning pins 122 provided on the front surface of the base table 90 into the respective one of the two positioning holes 30 of the opening and closing lid 10. This state is shown in FIG. 12A in which the key groove 18 formed on the lock plate 16 (also refer to FIG. 5) is positioned so that the longitudinal direction thereof coincides with the horizontal direction. Additionally, in response to this, the rectangular parallelepiped key member 26 is also positioned so that the longitudinal direction thereof coincides with the horizontal direction.

In this state, the base table 90 is further moved forward by driving the horizontal moving means 99 as shown in FIG.

12B so as to insert the key member 26 into the key groove 18 formed on the lock plate 16. At this time, the ring-like elastic member 98 provided on the front surface of the base table 90 contacts the front surface of the lock plate covering member 22. In this state, the air cylinder 132 (refer to FIG. 11) of the key member turning mechanism 94 is driven so as to move the rod 130 in an opening direction. Thereby, the operation rod 144 fixed to the base of the main operation rod 144 is turned 90 degrees in the opening direction. At the same time, the main operation rod 114 also rotates 90 degrees as shown in FIG. 12C, and, thereby, the key member 26 inserted into the key groove 18 is also turned, which results in the lock plate 16 rotating 90 degrees. As a result, as explained with reference to FIG. 15, the pin 24 of the locking mechanism 12 is retracted, thereby unlocking the opening and closing lid 10.

In this state, the piston rod 128 is slightly extended by moving the key member turning mechanism moving means 96 shown in FIG. 10. Thereby, the assist plate 124 and the key member turning mechanism 94 integrally fixed to the assist plate 124 move away from the base table 90. As a result, as shown in FIG. 12D, the base table 90 does not move but the main operation rod 114 alone slightly moves backward. At this time, the lock plate covering member 22 which is a part of the opening and closing lid 10 is securely and elastically held between the key member 26 and the elastic member 98 provided on the front surface of the base table 90. It should be noted that, in the present embodiment, although the elastic member 98 is formed of an elastically deformable material such as silicon rubber, the elastic deformation is not a main function of the elastic member 98. That is, the purpose of providing the elastic member 98 is to provide a non-slipping function so that the opening and closing lid 10 cannot move when the opening and closing lid 10 is put between the key member 26 and the base table 90. Accordingly, the elastic member 98 is formed of a material having a high coefficient of friction with respect to the opening and closing lid 10. Additionally, since the base table 90 itself has a high coefficient of friction with respect to the opening and closing lid 10, the elastic member is not necessarily provided if the opening and closing lid 10 does not move.

In a state in which the lock plate covering member 22 is sandwiched as mentioned above, the base table 90 and the assist table 124 together move backward by moving the rod 104 by driving the horizontal moving means 99. Thereby, the opening and closing lid 10 is removed from the accommodation box 2. Then, the opening and closing lid 10 is moved vertically downward to a position where the opening and closing lid 10 cannot be an obstacle to a detection of the sensor by moving the vertical moving means 100. At this time, as mentioned above, since the lock plate covering member 22 which is a part of the opening and closing lid 10 is securely held between the key member 26 and the elastic member 98, the opening and closing lid 10 is prevented from being displaced. Accordingly, when the opening and closing lid 10 is reattached to the accommodation box 2 by performing aforementioned operation in a reverse manner, the opening and closing lid 10 can be smoothly and accurately reattached to the accommodation box 2 without positional offset. It should be noted that in order to lock the opening and closing lid 110, the lock plate 16 is rotated 90 degrees in a direction opposite to the above-mentioned direction.

A description will now be given, with reference to FIG. 13 through FIG. 17D, of an opening and closing apparatus according to a second embodiment of the present invention. The opening and closing apparatus according to the second embodiment of the present invention corresponds to the second opening and closing apparatus 54 provided in the vicinity of the transfer stage 48.

Figure 13:
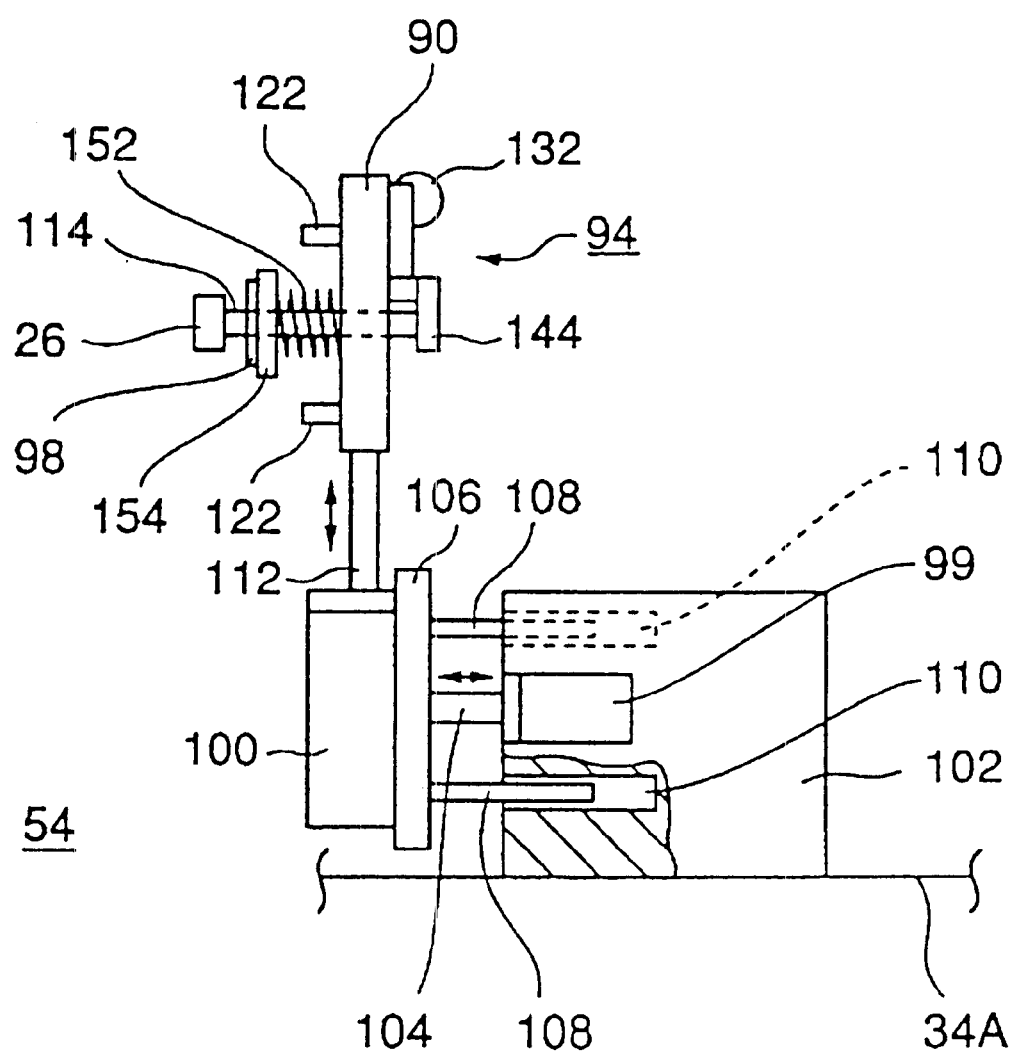
FIG. 13 is a side view of an opening and closing apparatus according to a second embodiment of the present invention.
Figure 14:
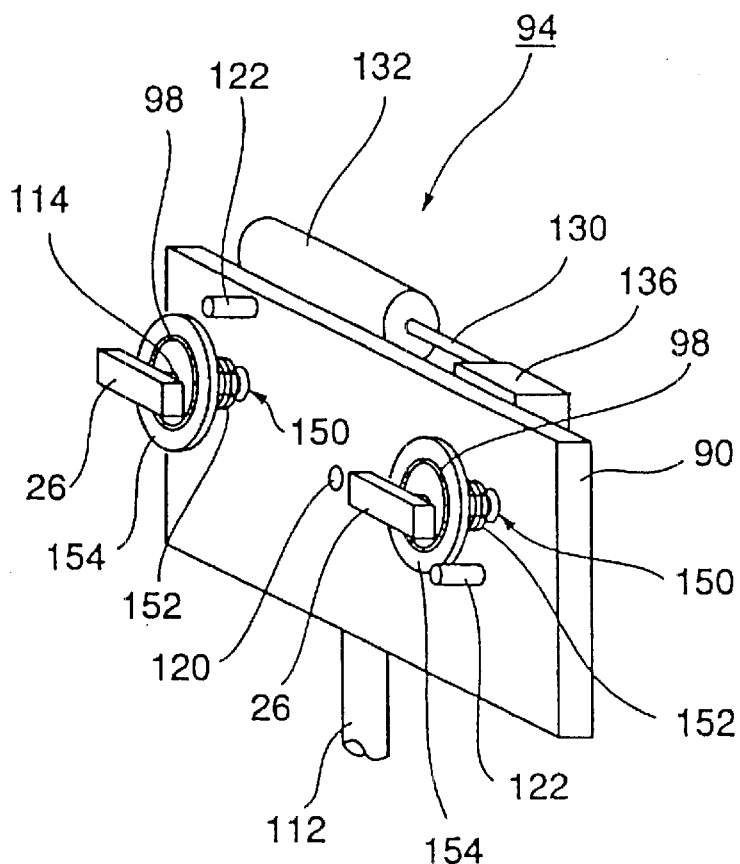
FIG. 14 is a perspective view showing the opening and closing apparatus according to the second embodiment of the present invention.
Figure 15:
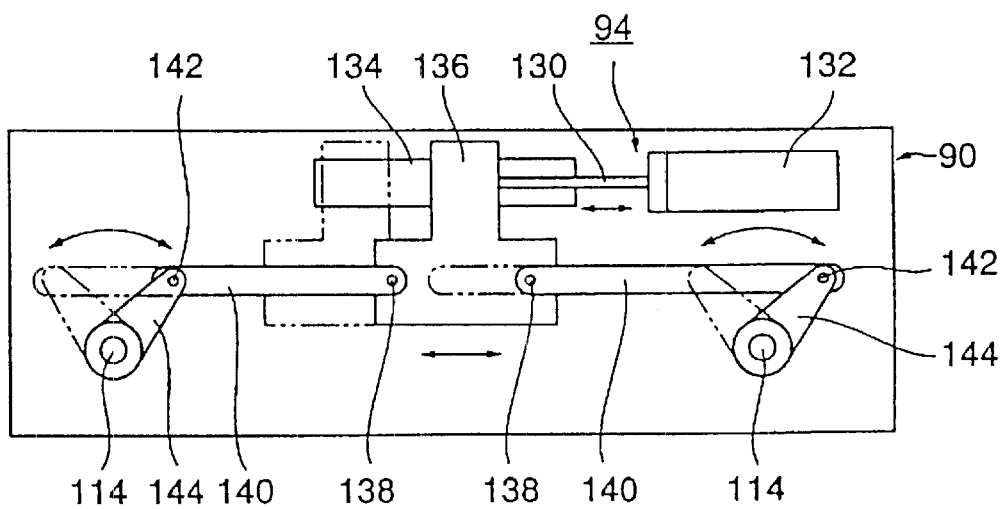
FIG. 15 is a rear view of the opening and closing apparatus according to the second embodiment of the present invention.
Figure 16:
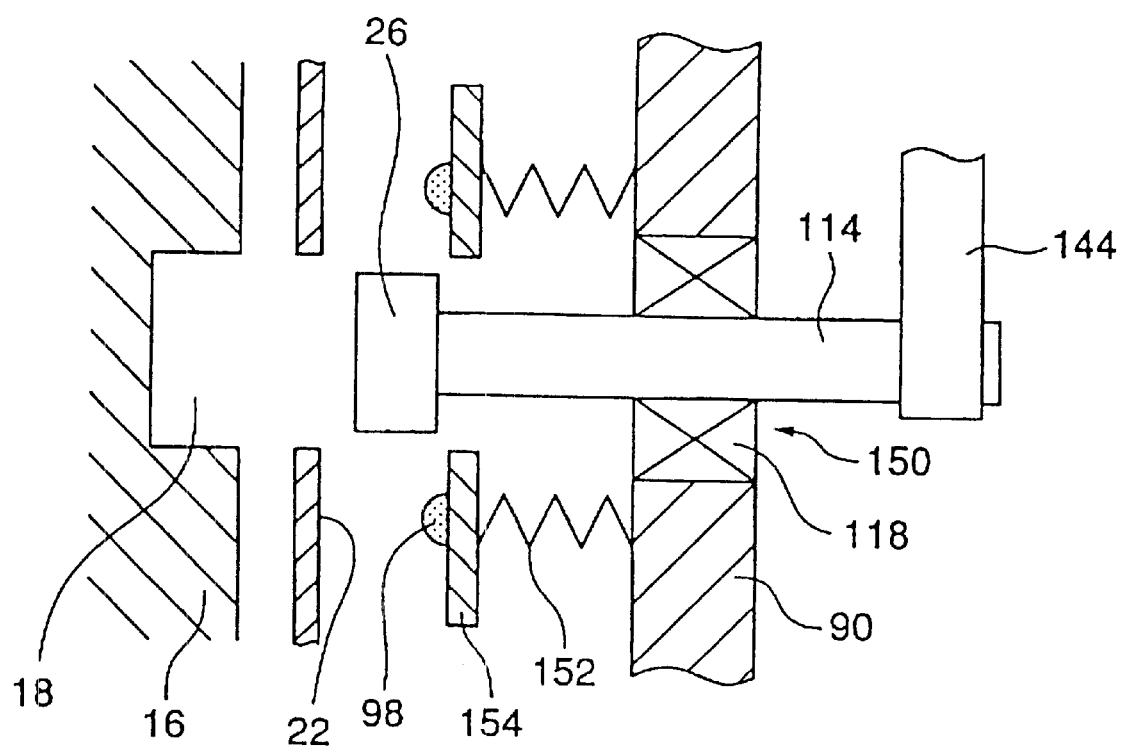
FIG. 16 is an enlarged partial cross-sectional view for explaining an operational state of the opening and closing apparatus according to the second embodiment of the present invention.

FIG. 13 is a side view of the second opening and closing apparatus 54, and FIG. 14 is a perspective view showing the second opening and closing apparatus 54. Additionally, FIG. 15 is a rear view of a part of the second opening and closing apparatus 54. FIG. 16 is a cross-sectional showing an operation of the second opening and closing apparatus 54. Additionally, FIGS. 17A, 17B, 17C and 17D are views for explaining an opening and closing operation of the second opening and closing apparatus 54. It should be noted that in FIG. 13 through FIG. 17D, parts that are the same as the parts of the above-mentioned first opening and closing apparatus 52 are given the same reference numerals, and descriptions thereof will be omitted.

In the transfer stage 48, the accommodation box 2 is fixed to the horizontal actuator 72 (refer to FIG. 7) on the second placement table 70. In consideration of this point, the structure of the second opening and closing apparatus 54 can be simplified as compared to the first opening and closing apparatus 52.

As shown in FIG. 13, the second opening and closing apparatus 54 comprises: a plate-like base table 90; a key member 26 provided to the base table 90 via a bearing mechanism 150 (refer to FIG. 14) which enables the key member 26 to turn (but not slide) with respect to the base table 90; a key member turning mechanism 94 turning the key member 26 in a normal or reverse direction; an assist table 1154 urged by a spring member 152 so as to be separate from the base table 90 in front of the base table 90; an elastic member 98 provided on the front surface of the assist table 154 so as to hold a part of the opening and closing lid 10 between the key member 26 and the assist table 154; a horizontal moving means 99 for moving the base table 90 in the horizontal direction; and a vertical moving means 100 for moving the base table 90 in the vertical (up and down) direction.

Figure 17:
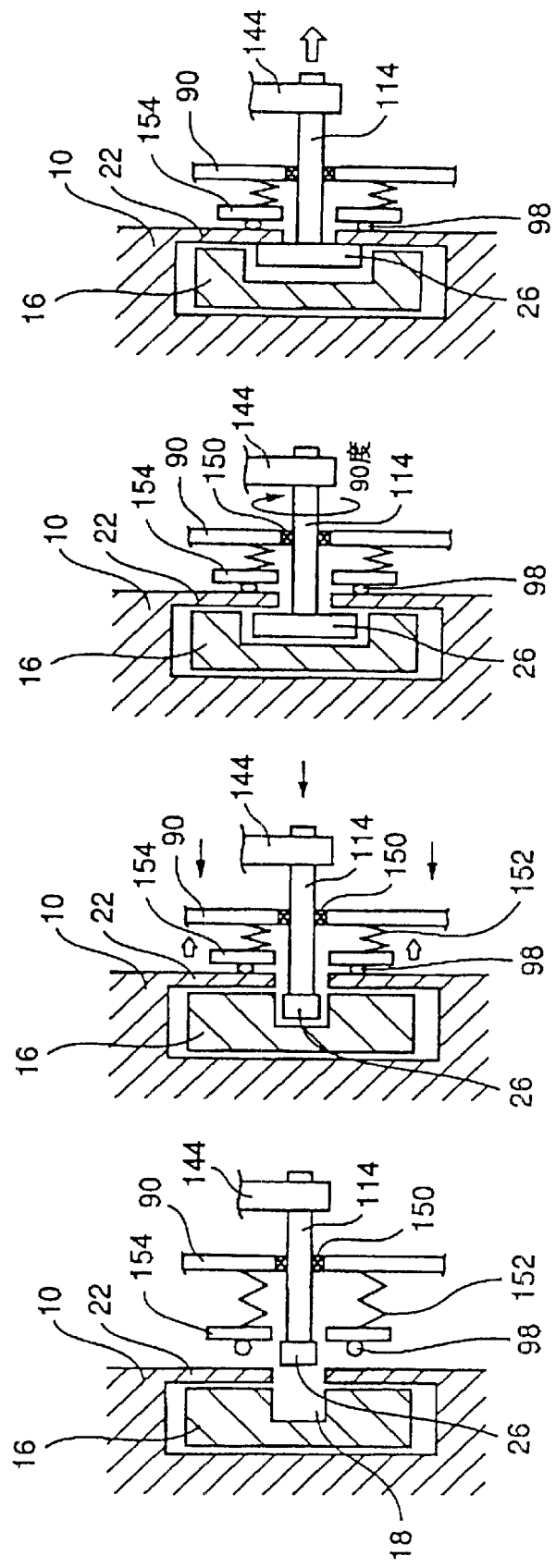
FIGS. 17A, 17B, 17C and 17D are views for explaining an opening and closing operation of the opening and closing apparatus according to the second embodiment of the present invention.

Specifically, the horizontal moving means 98, the vertical moving means 100 and the base able 90 are than same as that of the first opening and closing apparatus 52. However, the bearing mechanism 150 supporting the main operation rod 114 is constituted by the rotational bearing 118 as shown in FIG. 17 and the slide bearing 116 is not provided since the bearing mechanism 150 merely allow the rotation of the main operation rod 114. A key member turning mechanism 94 is provided on the backside of the base table as shown in FIG. 15. The key member turning mechanism 94 has the same structure as that described with reference to FIG. 5 except that the key member turning mechanism 94 is provided to the base table 90.

In the second opening and closing apparatus 54, the ring-like assist table 154 is provided between the base table 90 and the rectangular parallelepiped key member 26 in front of the base table 90. That is, the above-mentioned main operation rods 114 is extended through the center of the ring-like assist table 154, and the spring member 152 comprising a coil spring is provided between the assist table 154 and the front surface of the base table 90 so as to continuously urge the assist table forward. A diameter of the center opening of the assist table 154 is set smaller than a length of the rectangular parallelepiped key member 26 so that the assist table is prevented from protruding forward from the key member 26. Additionally, the ring-like elastic member 98 is provided on the front surface of the assist table 154.

A description will now be given, with reference to FIG. 17A through FIG. 17D, of an operation of the thus-structured second opening and closing apparatus 54. It should be noted that only a main part is shown in FIGS. 17A through 17D, and the arm 23 connected to the lock plate 16 (refer to FIGS. 3A and 3B) is omitted.

As mentioned above, the second opening and closing apparatus 54 is for opening and closing the opening and closing lid 10 of the accommodation box 2 placed on the transfer stage 48. First, similar to the first opening and closing apparatus 52, the base table 90 is moved close to the opening and closing lid 10 by driving the horizontal moving means 99 and the vertical moving means 100. Then, positioning of the base table 90 is performed by inserting the two positioning pins 122 provided on the front surface of the base table 90 into the respective one of the two positioning holes 30 of the opening and closing lid 10. This state is shown in FIG. 17A in which the key groove 18 formed on the lock plate 16 (also refer to FIG. 16) is positioned so that the longitudinal direction thereof coincides with the horizontal direction. Additionally, in response to this, the rectangular parallelepiped key member 26 is also positioned so that the longitudinal direction thereof coincides with the horizontal direction.

In this state, the base table 90 is further moved forward by driving the horizontal moving means 99 as shown in FIG. 17B so as to gradually insert the key member 26 into the key groove 18 formed on the lock plate 16. At this time, the ring-like elastic member 98 provided on the front surface of the assist table 154 contacts the front surface of the lock plate covering member 22. When the base table 90 is moved forward against the spring force of the spring member 152, the spring member 152 is compressed and the key member 26 is completely inserted into the key groove 18. It should be noted that although the accommodation box 2 is strongly pressed in a backward direction at this time, the accommodation box 2 does not move due to a reaction since the accommodating box 2 is fixed to the second placement table 70 by the horizontal actuator (refer to FIG. 7).

In this state, the air cylinder 132 (refer to FIG. 15) of the key member turning mechanism 94 is driven so as to move the rod 130 in an opening direction. Thereby, the operation rod 144 fixed to the base of the main operation rod 144 is turned 90 degrees in the opening direction. At the same time, the main operation rod 114 also rotates 90 degrees as shown in FIG. 17C, and, thereby, the key member 26 inserted into the key groove 18 is also turned, which results in the lock plate 16 rotating 90 degrees. As a result, as explained with reference to FIGS. 3A and 3B, the pin 24 of the locking mechanism 12 is retracted, thereby unlocking the opening and closing lid 10.

Next, in this state, the rod 104 is moved backward by driving the horizontal moving means 99 so as to move the base table backward. At this time, the lock plate covering member 22 which is a part of the opening and closing lid 10 is securely and elastically held between the key member 26 and the elastic member 98 provided on the front surface of the assist table 154 due to an elastic restoration force of the spring member 152 as shown in FIG. 17D.

The opening and closing lid 10 is removed from the accommodation box 2 by further moving the base table 90 in the backward direction by driving the horizontal moving means in a state in which the lock plate covering member 22 is sandwiched. Then, the opening and closing lid 10 is moved vertically downward to a position where the opening and closing lid 10 cannot be an obstacle to a detection of the sensor by moving the vertical moving means 100. At this time, as mentioned above, since the lock plate covering member 22 which is a part of the opening and closing lid 10 is securely held between the key member 26 and the elastic member 98, the opening and closing lid 10 is prevented from being displaced. Accordingly, when the opening and closing lid 10 is reattached to the accommodation box 2 by performing aforementioned operation in a reverse manner, the opening and closing lid 10 can be smoothly and accurately reattached to the accommodation box 2 without positional offset. It should be noted that in order to lock the opening and closing lid 10, the lock plate 16 is rotated 90 degrees in a direction opposite to the above-mentioned direction. Additionally, in this case, since there is no need to provide the assist plate 124 and the key member turning mechanism moving means 96 provided in the first opening and closing apparatus 52, the structure of the second opening and closing apparatus 54 can be simplified.

Figure 18:
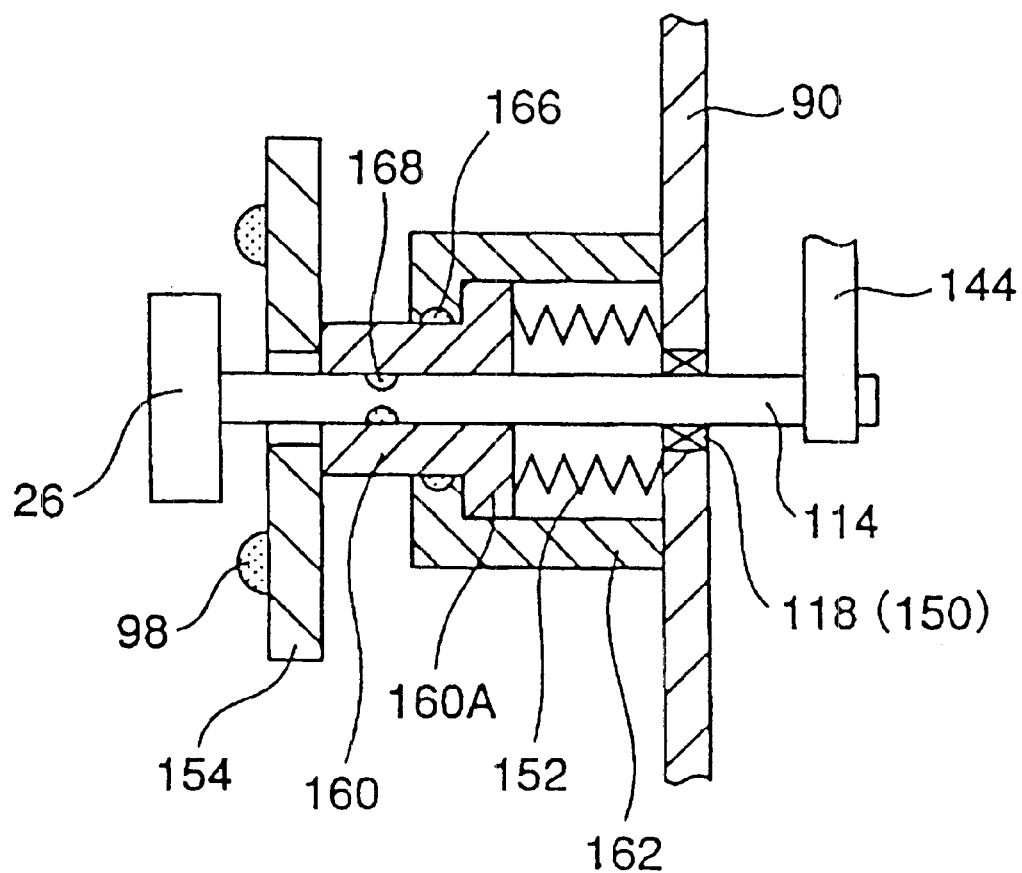
FIG. 18 is a cross-sectional view of a variation of the opening and closing apparatus according to the second embodiment of the present invention.

As a variation, the second opening and closing apparatus 54 may be constructed as shown in FIG. 18. In this variation, the main operation rod 114 is provided to the base of the assist table 154 in a state in which the main operation rod 114 extends therethrough. A cylindrical sliding member 160 is provided so that the sliding member 160 slides along the main operation rod 114, and an enlarged portion 160A having a larger diameter is formed on an end of the sliding member 160. A cylindrical stopper member 162 is provided to the base table 90 so as to surround the enlarged portion 160A of the sliding member 160 and allow the sliding movement within a predetermined stroke. The spring member 152 is fitted in the stopper member 162 so as to continuously urge the enlarged portion 160A forward. Additionally, sealing members 166 and 168 such as O-rings are provided between the sliding surfaces of the stopper member 162 and the assist member 160 and between the contacting surfaces of the sliding member 160 and the main operation rod 114, respectively, so as to positively prevent an atmosphere from flowing between the wafer transportation area 38 and the accommodation box transportation area.

In the case of this variation, since the sliding motion of the assist table 154 is guided by the stopper member 162, the motion of the assist table 154 can be stabilized. Additionally, since the key member 26 and the assist table 154 do not contact each other, generation of particles can be prevented.

Figure 19:
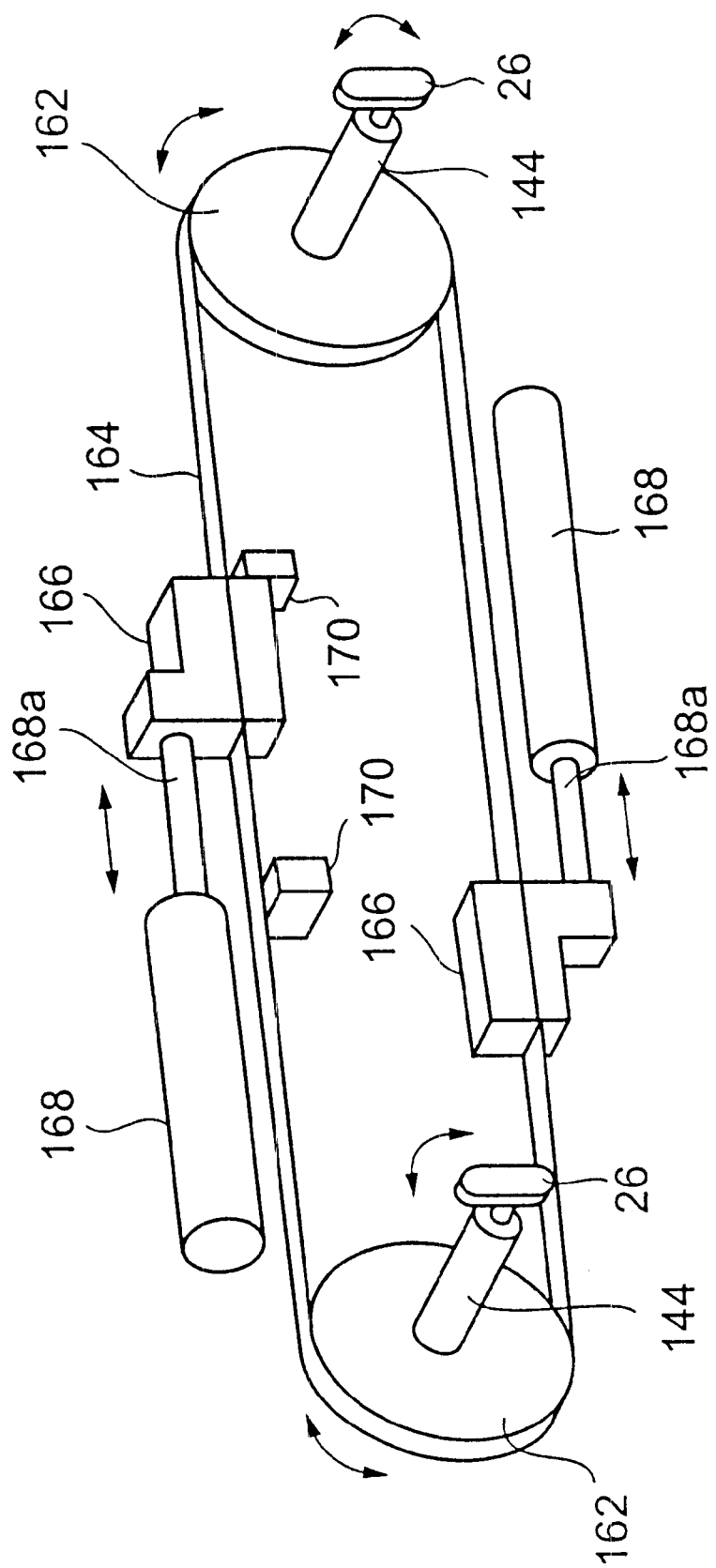
FIG. 19 is a perspective view of another example of a key member turning mechanism of the opening and closing apparatus.

A description will now be given, with reference to FIG. 19, of another example of the key member turning mechanism 94 used in the above-mentioned first and second opening and closing apparatuses 52 and 54. FIG. 19 is a perspective view of another example of the key member turning mechanism 94 used in the above-mentioned first and second opening and closing apparatuses 52 and 54.

The key member turning mechanism 160 is provided to the base table 90 of the first and second above-mentioned opening and closing apparatuses instead of the key member turning mechanism 94. The above-mentioned key member turning mechanism 94 converts a reciprocal motion to a rotational motion as shown in FIGS. 11 and 15 in detail. That is, by linearly moving one end of the horizontal rod 140, the main operation rod 114 is rotated via the operation rod 144 that is rotatably engaged with the other end of the vertical rod 140.

In such a crank mechanism, a force exerted on the main operation rod 144 is minimum in the middle of the rotation of the main operation rod 114, that is, in a state in which the longitudinal direction of the operation rod 144 shown in FIG. 11 coincides with the vertical direction. Accordingly, in the turning mechanism having the key member 26 that is moved by the crank mechanism, the rotation force of the key member 26 is weakened in the middle of the rotation and the key member may not rotate smoothly.

In the key member turning mechanism 160 shown in FIG. 19, a uniform rotational force can be obtained at any rotational position of the key member 26 by converting a liner motion generated by an air cylinder into a rotational motion by a belt and pulleys. That is, the main operation rod 114 supporting each of the two key members 26 is fixed to the center of a respective one of the pulleys 162. The pulleys 162 are rotatably mounted to the base table 90, and the pulleys 162 are engaged with a loop-like timing belt 164. The timing belt 164 may be a corrugated timing belt so that there is less slippage generated between the timing belt 164 and the pulleys 162.

A moving member 166 is fixed to the trimming belt 164 between the pulleys 162. The moving member 166 is connected to a drive shaft 168a of the air cylinder 168 so as to linearly moving the moving member 166 by driving the drive shaft 168a. The timing belt 164 is driven by the linear movement of the moving member 166, which results in rotation of the pulleys 162 being engaged with the timing belt. The key members 26 are turned by the rotational movement of the pulleys 162.

In the above-mentioned turning mechanism using the timing belt and the pulleys, the pulleys 162 rotate with a uniform force when the timing belt moves with a uniform force. That is, the key member 26 can be smoothly turned with a uniform force since the torque of the pulleys 162 does not vary. Accordingly, a problem that the opening and closing lid 10 cannot be operated due to a stop of the key member 26 in the middle of rotation can be prevented. Additionally, the torque of the pulleys 26 can be easily changed by changing the diameter of the pulleys 26.

Additionally, a travel of the timing belt can be limited by providing stoppers 170 on opposite sides of the moving member 166 in the direction of movement thereof, thereby limiting a range of rotation of the pulleys 162, that is, a range of rotation of the key members 26.

It should be noted that in the example shown in FIG. 19, two air cylinders 168 and two moving members 166 are provided to drive the timing belt 164 at both an upper portion and a lower portion of the timing belt 164. The reason for providing two air cylinders 168 is to reduce the diameter of each of the air cylinders 168. Accordingly, if there is no limitation in a space in which the air cylinder is provided and an air cylinder having a large diameter can be provided, or if an air pressure provided to the air cylinder can be sufficiently increased, an air cylinder may be provided at either one of the upper portion and the lower portion of the timing belt 164.

In the above-mentioned embodiment, although the first opening and closing apparatus 52 is provided to the transportation port 42 and the second opening and closing apparatus 54 is provided to the transfer stage 48 as shown in FIG. 7, the first opening and closing apparatus 52 may be provided to the transfer stage 48 and the second opening and closing apparatus 54 may be provided to the transportation port 42. Alternatively, the same kind of opening and closing apparatus may be provided to both the transportation port 42 and the transfer stage 48. However, when the second opening and closing apparatus 54 is used, a fixing apparatus such as the horizontal actuator 72 must always be provided to the placement table on which the accommodation box 2 is placed.

Additionally, although the description is given of the case in which the semiconductor wafer is used as an object to be processed, the present invention is not limited to the semiconductor wafer and the present invention can be applied to a case in which an LCD substrate or a glass substrate is processed.

As mentioned above, according to the opening and closing apparatus of an opening and closing lid of an accommodation box of an object to be processed and a processing system of an object to be processed according to the present invention, the following actions and effects can be provided. That is, when the opening and closing lid of an accommodation box which accommodates an object to be processed is opened and closed, since the opening and closing lid can be securely held when being removed from the accommodation box, a positional offset of the opening and closing lid can be prevented. Accordingly, when the opening and closing lid is reattached to the accommodation box, the opening and closing lid can be smoothly and accurately attached to the accommodation box. Additionally, since a part of the opening and closing lid is held in the vicinity of the turning key of the opening and closing lid is positioned, an excessive force is not exerted on the opening and closing lid itself.

The present invention is not limited to the specifically disclosed embodiments, and variations and modifications may be made without departing from the scope of the present invention.

What is claimed is:

1. An opening and closing apparatus (52) for opening and closing an opening and closing lid (10) which closes an opening part (4) of an accommodating box (2) for accommodating an object (W) to be processed and is locked by a locking mechanism (12), characterized in that the opening and closing apparatus comprises:

a base table (90);

a key member (26) mounted to said base table (90) via a bearing mechanism (92) in a state in which the key member is rotatable with respect to the base table (90) and movable in a vertical direction with respect to a front surface of said base table (90);

a key member turning mechanism (94, 160) which turns the key member (26) in either a normal or reverse directions;

key member turning mechanism moving means (96) for moving the key member turning mechanism (94, 160) in said vertical direction with respect to said base table (90);

horizontal moving means (99) for moving said base table (90) in a horizontal direction with respect to said accommodation box (2); and vertical moving means (100) for moving said base table (90) in a vertical direction with respect to said accommodation box (2).

2. The opening and closing apparatus as claimed in claim 1, characterized in further comprising an elastic member (98) provided on the front surface of said base table (90), and a part of said opening and closing lid (10) is held by being put between said key member (26) and said elastic member (98).

3. An opening and closing apparatus (52) for opening and closing an opening and closing lid (10) which closes an opening part (4) of an accommodating box (2) for accommodating an object (W) to be processed and is locked by a locking mechanism (12), characterized in that the opening and closing apparatus comprises:

a base table (90);

a key member (26) mounted on said base table (90) via a bearing mechanism (150) in a state in which the key member is rotatable with respect to the base table (90);

a key member turning mechanism (94) which turns the key member (26) in either a normal or reverse direction;

an assist table (154) positioned in front of said base table (90) and urged by a spring member (152) in a direction apart away from said base table (90);

horizontal moving means (99) for moving said base table (90) in a horizontal direction with respect to said accommodation box (2); and vertical moving means (100) for moving said base table (90) in a vertical direction with respect to said accommodation box (2).

4. The opening and closing apparatus as claimed in claim 3, characterized in further comprising an elastic member (98) provided on the front surface of said base table (90), and a part of said opening and closing lid (10) is held by being put between said key member (26) and said elastic member (98).

5. The opening and closing apparatus as claimed in claim 3 or 4, characterized in that said spring member (152) is a coil spring provided between said base table (90) and said assist table (154).

6. The opening and closing apparatus as claimed in claim 1 or 3, characterized in that at least two locking mechanisms are provided to said opening and closing lid (10), and a number of key members (26) is equal to a number of said locking mechanisms.

7. The opening and closing apparatus as claimed in claim 1 or 3, characterized in that said key member turning mechanism (94) comprises:

an air cylinder (132) generating a linear motion; and a crank mechanism (140, 144) converting the linear motion into a rotating motion.

8. The opening and closing apparatus as claimed in claim 1 or 3, characterized in that said key member turning mechanism (94) comprises:

an air cylinder (168) generating a linear motion;

a belt (164) driven by said air cylinder (168); and a pulley (162) to which said key member (26) is mounted, the pulley being rotationally driven by being engaged with said belt (164).

9. A processing system (32) of an object (W) to be processed, the object being transported by being accommodated in an accommodating box (2), comprising:

a transportation port (42) transporting said accommodating box (2) into the processing system (32) or out of the processing system (32);

stocker unit (44) temporarily storing said accommodation box (2);

a transfer stage (48) moving said accommodating box (2) in which said object (W) to be processed is accommodated between said stocker unit (44) and a boat (46) of an object to be processed;

a processing unit (50) applying a predetermined process to said object (W) to be processed which is I held by said boat (46) of the object; and an opening and closing apparatus according to claims 1 or 3 which is provided in the vicinity of said transportation port (42) and/or said transfer stage (48).

* * * * *